United States Patent
Cantell et al.

(10) Patent No.: US 6,793,735 B2
(45) Date of Patent: Sep. 21, 2004

(54) INTEGRATED COBALT SILICIDE PROCESS FOR SEMICONDUCTOR DEVICES

(75) Inventors: Marc W. Cantell, Sheldon, VT (US); Jerome B. Lasky, Essex Junction, VT (US); Ronald J. Line, Essex Junction, VT (US); William J. Murphy, Essex Junction, VT (US); Kirk D. Peterson, Essex Junction, VT (US); Prabhat Tiwari, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 211 days.

(21) Appl. No.: 09/748,965

(22) Filed: Dec. 27, 2000

(65) Prior Publication Data

US 2001/0001298 A1 May 17, 2001

Related U.S. Application Data

(62) Division of application No. 09/365,859, filed on Aug. 3, 1999, now Pat. No. 6,184,132.

(51) Int. Cl.[7] .......................... C23C 16/00; C23F 1/00; H01L 21/00
(52) U.S. Cl. ............. 118/719; 156/345.31; 204/298.25; 204/298.26; 204/298.35; 414/939
(58) Field of Search ................ 118/719; 156/345.31, 156/345.32; 204/298.25, 298.26, 298.35; 414/939

(56) References Cited

U.S. PATENT DOCUMENTS

| | | | | |
|---|---|---|---|---|
| 3,915,117 A | * | 10/1975 | Schertler ..................... | 118/49 |
| 4,266,208 A | * | 5/1981 | Cornish ....................... | 333/218 |
| 4,824,309 A | * | 4/1989 | Kakehi et al. ............... | 414/217 |
| 4,911,597 A | * | 3/1990 | Maydan et al. ............. | 414/217 |
| 4,966,519 A | * | 10/1990 | Davis et al. ................ | 414/805 |
| 5,002,464 A | * | 3/1991 | Lee ............................ | 417/152 |
| 5,043,299 A | | 8/1991 | Chang et al. | |
| 5,043,300 A | | 8/1991 | Nulman | |
| 5,232,508 A | * | 8/1993 | Arena et al. ................ | 118/719 |
| 5,344,793 A | | 9/1994 | Zeininger et al. | |
| 5,478,780 A | | 12/1995 | Koerner et al. | |
| 5,498,768 A | | 3/1996 | Nishitani et al. | |
| 5,635,426 A | | 6/1997 | Hayashi et al. | |
| 5,780,361 A | | 7/1998 | Inoue | |
| 5,913,978 A | * | 6/1999 | Kato et al. .................. | 118/719 |
| 6,203,619 B1 | * | 3/2001 | McMillan .................... | 118/719 |
| 6,235,656 B1 | * | 5/2001 | Clarke ........................ | 438/800 |
| 6,395,192 B1 | * | 5/2002 | Nemirovsky et al. ......... | 216/66 |

FOREIGN PATENT DOCUMENTS

JP 63000480 A * 1/1988 .......... C23C/16/50

* cited by examiner

Primary Examiner—Parviz Hassanzadeh
Assistant Examiner—Karla Moore
(74) Attorney, Agent, or Firm—DeLio & Peterson, LLC; Kelly M. Reynolds; William D. Sabo

(57) ABSTRACT

A method and apparatus are provided for forming a silicide on a semiconductor substrate by integrating under a constant vacuum the processes of removing an oxide from a surface of a semiconductor substrate and depositing a metal on the cleaned surface without exposing the cleaned surface to air. The method and apparatus of the present invention eliminates the exposure of the cleaned substrate to air between the oxide removal and metal deposition steps. This in-situ cleaning of the silicon substrate prior to cobalt deposition provides a cleaner silicon substrate surface, resulting in enhanced formation of cobalt silicide when the cobalt layer is annealed.

17 Claims, 1 Drawing Sheet

INTEGRATED COBALT SILICIDE PROCESS FOR SEMICONDUCTOR DEVICES

BACKGROUND OF THE INVENTION

1. Field of the Invention

The present invention relates generally to a method and apparatus for fabricating semiconductor devices and, in particular, to a method and apparatus for forming cobalt silicide on a semiconductor substrate.

2. Description of Related Art

One of the preferred materials useful in forming silicide regions in the fabrication of semiconductor integrated circuits is cobalt. The use of cobalt to form silicide regions is preferred over alternative materials such as titanium and its alloys, platinum or palladium, because cobalt silicide provides low resistivity, allows shallow junctions and lower-temperature processing, and other such advantages.

In the prior art, cobalt silicide is formed on a semiconductor device by depositing a layer of cobalt on a silicon substrate and then annealing the cobalt containing surface to form cobalt silicide. Various methods are known in the art for depositing the cobalt on the silicon and include sputtering and evaporation. For convenience, the following description will be related to a sputtering process using a vacuum sputtering device, but it will be appreciated by those skilled in the art that other such devices and processes may be used to deposit cobalt on a silicon surface.

In the sputtering process, a coating of cobalt is deposited on the surface of a semiconductor substrate or wafer. The thickness of the cobalt coating is typically up to about 300 Å and extends across the exposed surfaces of the wafer. The cobalt is typically sputtered onto a heated wafer using an energy field on the cobalt target to generate cobalt atoms in an atmosphere of argon. After cobalt deposition, the wafer is subjected to a heat treatment to anneal the cobalt to form cobalt silicide. The non-reacted cobalt layer is then removed by an etch treatment using an etchant, such as a mixture of hydrogen peroxide and sulfuric acid.

The formation of cobalt silicide is important for very high density semiconductor devices where the feature size is reduced to a fraction of a micrometer. The silicide formed needs to provide good ohmic contacts, reduce the sheet resistivity of source/drain regions and polysilicon interconnections, increase the effective contact area and provide an etch stop.

Unfortunately, cobalt silicide formation on the surface of the silicon substrate is not uniform for resistance and leakage across the wafer surface due to the presence of native silicon oxide on the surface of the silicon. Native oxide forms on the surface of the substrate during air exposure. The presence of native oxide on the wafer prevents cobalt silicide formation because cobalt cannot consume the oxides on the wafer surface during the deposition process. Metals such as titanium do not have this problem since titanium readily reacts with oxide and exposes clean silicon.

The native oxide may be removed from the substrate by pre-cleaning prior to cobalt deposition, but exposure of the cleaned semiconductor substrate to even low pressure environments results in oxide growth on the cleaned surface in seconds. In addition, this removal of native oxide is not uniform across the wafer or consistent wafer-to-wafer. Ex-situ pre-cleaning of the wafer is not a solution because the argon gas used in the device during sputtering occupies damaged locations in the silicon, prevents silicide formation and oxides readily reform on the substrate surface.

Currently, conventional processes for removing the native oxide from a silicon substrate prior to the deposition of cobalt include a buffered hydrofluoric acid ("HF") cleaning process, followed by air exposure of less than two hours and then cobalt deposition. A nitrogen triflouride ("$NF_3$") cleaning process, followed by a buffered HF cleaning, air exposure of less than two hours and then cobalt deposition, has been proposed, and shows some benefits over prior processes. However, since the substrate cleaning processes of the prior art allow the cleaned substrate to be exposed to air prior to the deposition process, oxide formation on the silicon substrate continues to present a problem.

After pre-cleaning, the wafers are loaded into a sputtering device which is subsequently evacuated to a low pressure. The remaining native oxide is removed by an in-situ RF sputter clean in an argon atmosphere prior to cobalt deposition. However, where charge damage is a concern, this process is not effective since the wafer can reoxidize in 1 second at $10^{-7}$ torr and the argon gas occupies damaged locations in the silicon. This prevents silicide formation and oxides readily reform prior to cobalt deposition.

While the formation of a silicide on a silicon substrate is discussed in the prior art, the problem of oxide formation due to air exposure is not resolved. For instance, in U.S. Pat. No. 5,780,361, a process is disclosed wherein a substrate is subject to an HF wet etch, followed by cobalt deposition and an annealing process to form monocobalt disilicide. The prior art does not describe any in-situ cleaning of the substrate prior to cobalt deposition, and if there is an oxide interface present on the substrate, the desired mono-silicide reaction will not take place.

Bearing in mind the problems and deficiencies of the prior art, it is therefore an object of the present invention to provide a method and apparatus to prevent the formation of an oxide on the surface of a semiconductor substrate prior to cobalt deposition.

It is another object of the present invention is to provide a method and apparatus to eliminate air exposure of a semiconductor substrate prior to cobalt deposition.

A further object of the present invention to provide a method and apparatus to reduce the criticality of time windows for cobalt deposition after substrate pre-cleaning due to air exposure.

It is also an object of the present invention to provide a method and apparatus for the uniform formation of cobalt silicide across the surface of a semiconductor substrate.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method of forming a silicide on a semiconductor substrate. The method comprises the steps of providing a semiconductor substrate, preferably a silicon substrate, having an oxide on a surface thereof and creating a vacuum over the surface having the oxide. While in a constant vacuum, the oxide is removed from the surface of the substrate, preferably using a nitrogen triflouride cleaning process. Without breaking the vacuum, a metal, preferably cobalt, is deposited on the cleaned surface of the substrate. It is preferred that the metal is deposited on the substrate surface by vapor sputtering. A silicide is then formed on the substrate surface. In the preferred embodiment the silicide is cobalt silicide and is formed by annealing the substrate after the cobalt is deposited on the cleaned substrate surface.

In the preferred embodiment, the substrate is placed into a vacuum device having a plurality of interior chambers and adapted to provide a constant vacuum in each of the interior chambers during the oxide removal and metal deposition steps. The vacuum device preferably includes at least one chamber to remove the oxide and at least one chamber to deposit the metal. In the preferred embodiment the process further includes the step of transferring the substrate between the oxide removal chamber and the metal deposition chamber without breaking the vacuum.

In another aspect, the present invention comprises an apparatus for forming a silicide on a surface of a semiconductor substrate. The apparatus is adapted to form a vacuum therein and is further adapted to remove an oxide from the surface of the substrate and deposit a metal on the surface of the substrate while maintaining the vacuum. In the preferred embodiment, the apparatus comprises a chamber, at least one workpiece holder, at least one pump adapted to evacuate the chamber and at least one line operatively connected between the pump and chamber for evacuating the chamber. The apparatus also comprises at least one input line adapted to provide a chemical agent into the chamber to remove the oxide from the surface of the substrate, and at least one output line adapted to remove the cleaning agent and oxide from the chamber. The apparatus also comprises a heating element adapted to heat the substrate to an elevated temperature, and a reactor adapted to deposit the metal onto the substrate surface. In the preferred embodiment, the chamber comprises a plurality of interior chambers, with at least one interior chamber adapted to remove an oxide from a surface of the substrate while under vacuum, and at least one interior chamber adapted to deposit a metal on a surface of the substrate while under vacuum. In the preferred embodiment, the apparatus is adapted to remove the oxide from the surface of the substrate using a nitrogen triflouride cleaning process and the interior chamber to deposit the metal on the surface of the substrate is a vapor sputtering device.

In the preferred embodiment, the apparatus comprises at least one interior chamber adapted to heat the substrate to form a silicide on a surface of the substrate.

It is also preferred that the apparatus is adapted to provide a constant vacuum and transfer the substrate from the interior chamber adapted to remove oxide from a surface of the substrate to the interior chamber adapted to deposit a metal on a surface of the substrate, and then to the heating chamber, without breaking the vacuum.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
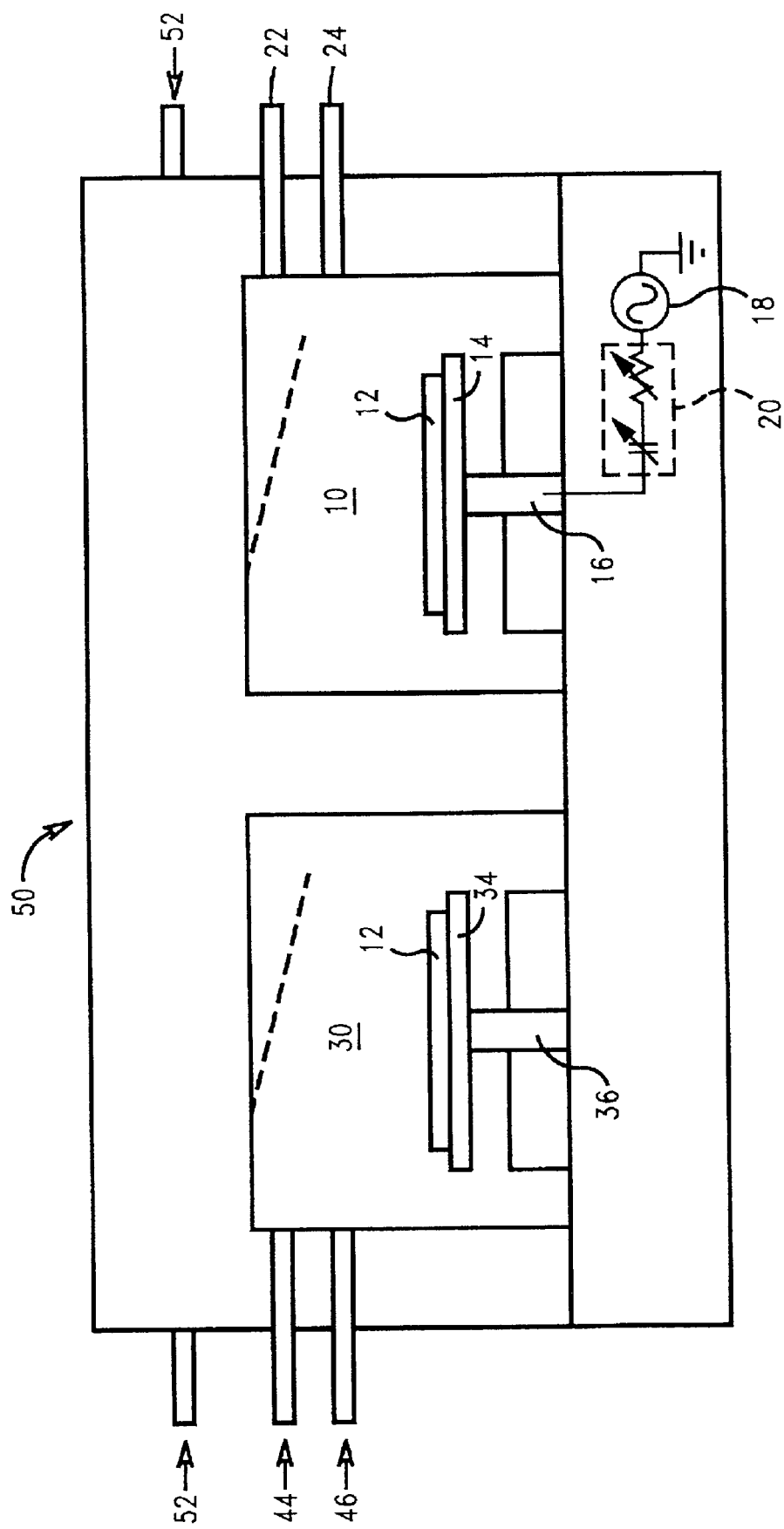
FIG. 1 is a schematic diagram of a mainframe of the present invention including a substrate cleaning chamber and a metal deposition chamber.

In describing the preferred embodiment of the present invention, reference will be made herein to FIG. 1 of the drawings in which like numerals refer to like features of the invention. Features of the invention are not necessarily shown to scale in the drawing.

It has been found that by eliminating the exposure of a silicon substrate to air after cleaning or removing oxide from the surface of a semiconductor substrate, the probability of native oxide forming on the surface of the silicon substrate is greatly reduced or eliminated. This permits the formation of a uniform silicide layer, such as cobalt silicide, across the surface of the substrate. By integrating the oxide removal process and metal deposition process under a constant vacuum, the cleaned substrate is not exposed to air between steps. In the formation of cobalt silicide, eliminating the exposure to air of the cleaned substrate results in a much more uniform cobalt silicide layer, heretofore not seen in the prior art without additional, and at times ineffective, substrate cleaning steps. As used herein, the terms "clean", "cleaned", "pre-clean" and "cleaning" each refer to the removal of an oxide or other impurities from a surface of a semiconductor substrate.

Using the method and apparatus of the present invention, while under a continuos and uninterrupted vacuum, a semiconductor substrate, such as a silicon substrate, is cleaned of oxide. The oxide is cleaned from the surface of the substrate with any cleaning agent commonly used to remove oxide, but preferably using a nitrogen triflouride ($NF_3$) cleaning process. A metal, preferably cobalt, is then deposited on the cleaned surface of the substrate. The substrate is then annealed to form a silicide over the surface of the substrate. In the preferred embodiment, the steps of cleaning and cobalt deposition are performed in an integrated device under a constant vacuum throughout each of the steps of the silicide formation process. Integrating these steps under vacuum prevents the cleaned substrate surface from exposure to air and greatly reduces the probability that native oxide will form or re-form on the surface of the cleaned substrate. Additional substrate cleaning steps are not required to form a uniform cobalt silicide layer.

As shown in FIG. 1, an integrated substrate cleaning and metal deposition device 50, is preferably used to clean a surface of substrate 12 and deposit a metal on the cleaned surface, each step being performed under a constant, uninterrupted vacuum. Substrate 12 is then annealed to form a silicide. The annealing process may take place in device 50, or substrate 12 may be transferred to an external heating device for annealing.

The preferred integrated vacuum device of the present invention comprises a mainframe 50 which may have one or more chambers, such as 10 and 30, integrated within mainframe 50. Mainframe 50 is preferably provided with lines 52 for evacuating, or providing a gas to, mainframe 50. Mainframe 50 is adapted to maintain a constant vacuum throughout each of its chambers during silicide formation operations. In the preferred embodiment, mainframe 50 comprises at least one cleaning chamber 10, also called an etch chamber, to remove oxide from a surface of substrate 12, and at least one metal deposition chamber, preferably a cobalt deposition chamber, to deposit metal on the cleaned surface of substrate 12. Mainframe 50 may also include a mechanism to transfer the workpiece, or substrate 12, between chambers without interrupting the vacuum.

In the preferred embodiment, cleaning chamber 10 of device 50 comprises a pedestal 14 on which the semiconductor substrate or wafer 12 to be cleaned is placed. A matching network 20 and RF generator 18 is preferably connected to shaft 16 of pedestal 14. Input/output lines 22 and 24 are provided into cleaning chamber 10 for the introduction of a gas, such as argon or $NF_3$. Cobalt deposition chamber 30 is preferably a vapor sputtering device. A pedestal 34 (typically made of stainless steel) is disposed on a vertical shaft 36 (typically made of stainless steel). Substrate 12, on which cobalt is to be deposited, is positioned and secured on pedestal 34.

During the formation of cobalt silicide, substrate 12 will be introduced into mainframe 50, and preferably chamber 10, for cleaning. Mainframe 50, and each of the chambers integral thereto, will be evacuated to a typical vacuum pressure prior to the cleaning process. Substrate 12 is then cleaned of any native oxide, preferably using an $NF_3$ cleaning process. In the preferred embodiment, the $NF_3$ cleaning process will produce a substrate surface relatively free from native oxide. Since vacuum is not broken between the steps of cleaning and metal deposition, the criticality of time windows between steps is reduced. Furthermore, the buffered HF step can be eliminated which reduces manufacturing complexity.

After cleaning, wafer 12 is preferably transferred to chamber 30 of mainframe 50 without breaking vacuum by any conventional process or mechanism. Once wafer 12 is positioned in chamber 30, wafer 12 will preferably undergo a cobalt deposition process or optionally, a titanium nitride deposition process.

The sputtering process is performed under widely varying conditions as is well-known in the art. In the typical sputtering process, a coating of cobalt is deposited on the face wafer and the thickness of the cobalt coating is typically up to about 300 Å and extends across all exposed surfaces of the face of the wafer or substrate. The cobalt is typically sputtered onto a heated wafer using an energy field on the cobalt target to generate cobalt atoms in an atmosphere of argon. After cobalt deposition, the wafer is subjected to a heat treatment to anneal the cobalt to form cobalt silicide. The non-reacted cobalt layer is then removed by an etch treatment using an etchant such as a mixture of hydrogen peroxide and sulfuric acid. A vapor sputtering device typically comprises a reactor which forms a chamber therein in which a wafer is disposed. A cobalt target is disposed at the upper end of the reactor and the target is electrically connected to an energy source. The reactor may be grounded by a conventional ground circuit. The wafer or substrate typically sits on a pedestal disposed on a vertical shaft, typically made of stainless steel. The vertical shaft may be electrically connected to an electrical circuit. For example, vapor sputtering device 30 is evacuated through line 46 to a pressure about $10^{-8}$ to $10^{-10}$ torr. Argon or other inert gas is shown as an input 44 to device 30 and the argon gas is flowed into device 30 to provide an argon pressure in the about 1 to 6 mtorr during the cobalt deposition process. A DC power of about 435 $mW/cm^2$ is typically supplied to the cobalt target 42. Chamber 30 is preferably adapted to heat substrate 12 during the cobalt deposition process. The temperature of substrate 12 during the cobalt deposition process is maintained at about 20° C. to 300° C.

After cobalt deposition, substrate 12 is annealed to form a silicide. The annealing process may take place in a chamber of device 50, or the substrate may be removed from device 50 and subjected to a heat treatment which can be performed in an external heating device. In general, the temperature of substrate 12 in the oven or heating chamber is ramped in a nitrogen flow at about 10° C./sec to about 575° C. and held at 575° C. for about 80 seconds then ramped down at 10° C./second to about 20° C. before removal of the substrate 12 from the oven. This heat treatment forms cobalt silicide regions over areas of silicon on substrate 12 covered by the cobalt. In other areas of substrate 12 containing insulators, no cobalt silicide is formed and the unreacted cobalt is removed using any of a variety of etchants.

By integrating the cleaning of substrate 12 and the cobalt deposition process in a mainframe under a constant vacuum, the air exposure after cleaning is eliminated and the probability of native oxide forming on the surface of substrate 12 is greatly reduced or eliminated. Since a key to the silicidation process is the surface cleaning of the substrate, reducing oxide formation on the surface of substrate 12 results in favorable and uniform cobalt deposition and silicide formation, which enhances resistance and leakage characteristics across the surface of the substrate. Since vacuum is not broken between cleaning and cobalt deposition, the criticality of time windows between steps is reduced. Furthermore, the buffered HF step can be eliminated which reduces manufacturing complexity.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An apparatus for selectively forming a silicide comprising:

a semiconductor substrate having a surface, a portion of said surface having silicon thereon and a portion of said surface having an insulator thereon, said surface further having an oxide thereover;

a mainframe housing at least an interior cleaning chamber for removing said oxide from said surface of said substrate white under a continuous vacuum, and an interior deposition chamber for depositing a metal on said surface of said substrate while under said continuous vacuum;

at least one workpiece holder within said mainframe adapted to hold said substrate;

at least one pump adapted to evacuate said mainframe to maintain said continuous vacuum in said mainframe such that said continuous vacuum comprises a constant vacuum throughout said mainframe and each of said interior cleaning chamber and said interior deposition chamber during said selective silicide formation at least one line operatively connected between said at least one pump and said mainframe for evacuating said mainframe;

at least one input line adapted to provide a chemical agent into said interior cleaning chamber within said mainframe while under said continuous vacuum, said chemical agent adapted to remove said oxide from said surface of said substrate;

at least one output line adapted to remove said cleaning agent and said removed oxide from said interior cleaning chamber and said mainframe;

a reactor in said deposition chamber within said mainframe, said reactor adapted to deposit said metal onto said silicon and insulator portions on said substrate surface while under said continuous vacuum;

a heating element, said heating element adapted to heat said substrate to an elevated temperature to form a silicide on said substrate surface over the silicon portion by reaction with the metal deposited thereon, while the metal remains unreacted over the insulator portion; and an etchant to remove unreacted metal from the substrate surface while leaving said silicide over portions of said semiconductor substrate.

2. The apparatus of claim 1 further comprising an interior heating chamber within said mainframe for heating said substrate to form said silicide on said substrate surface.

3. The apparatus of claim 2 wherein said apparatus is adapted to transfer said substrate between said interior cleaning chamber and said interior deposition chamber without breaking said continuous vacuum.

4. The apparatus of claim 3 wherein said substrate is a silicon substrate.

5. The apparatus of claim 4 wherein said apparatus is adapted to remove said oxide from said surface of said substrate using a nitrogen triflouride cleaning process.

6. The apparatus of claim 5 wherein said metal is cobalt.

7. The apparatus of claim 6 wherein said interior deposition chamber is a vapor sputtering device.

8. The apparatus of claim 7 wherein said apparatus is further adapted to transfer said substrate to said interior heating chamber from said interior deposition chamber.

9. The apparatus of claim 8 wherein said silicide is cobalt silicide.

10. A system for selectively forming a silicide on a surface of a semiconductor substrate comprising:

said semiconductor substrate having said surface, a portion of said surface having silicon thereon and a portion of said surface having an insulator thereon, said surface further having an oxide thereover;

a mainframe comprising at least an interior cleaning chamber adapted to remove said oxide from said surface of said substrate while under a continuous vacuum, and at least an interior deposition chamber adapted to deposit a metal on said surface of said substrate while under said continuous vacuum;

at least one pump adapted to evacuate said mainframe to maintain said continuous vacuum in said mainframe such that said continuous vacuum comprises a constant vacuum throughout said mainframe and each of said interior cleaning chamber and said interior deposition chamber during said selective silicide formation;

a chemical agent input into said interior cleaning chamber within said mainframe, said chemical agent for removing said oxide from said surface of said substrate while under said continuous vacuum;

a reactor in said deposition chamber within said mainframe, said reactor for depositing said metal onto said silicon and insulator portions on said substrate surface while under said continuous vacuum;

a heating element, said heating element adapted to heat said substrate to an elevated temperature to form a silicide on said substrate surface over the silicon portion by reaction with the metal deposited thereon, white the metal remains unreacted over the insulator portion; and an etchant to remove unreacted metal from the substrate surface while leaving said silicide over portions of said semiconductor substrate.

11. The system of claim 10 wherein said apparatus is adapted to transfer said substrate between said interior cleaning chamber and said interior deposition chamber without breaking said continuous vacuum.

12. The system of claim 10 wherein said metal is cobalt.

13. The system of claim 10 wherein said chemical agent is selected from the group consisting of nitrogen triflouride and argon.

14. The system of claim 10 wherein said reactor for depositing said metal on said surface of said substrate is a vapor sputtering device.

15. The system of claim 10 wherein said heating element is enhoused within said mainframe.

16. The system of claim 10 wherein said heating element is external thereto said mainframe.

17. The system of claim 10 wherein said unreacted cobalt is removed using an etchant comprising hydrogen peroxide and sulfuric acid.

* * * * *